(12) United States Patent
Bahary et al.

(10) Patent No.: US 10,270,473 B2
(45) Date of Patent: Apr. 23, 2019

(54) TURBO DECODERS WITH STORED COLUMN INDEXES FOR INTERLEAVER ADDRESS GENERATION AND OUT-OF-BOUNDS DETECTION AND ASSOCIATED METHODS

(71) Applicant: Freescale Semiconductor, Inc., Austin, TX (US)

(72) Inventors: Robert Bahary, Arlington Heights, IL (US); Eric J Jackowski, Austin, TX (US)

(73) Assignee: NXP USA, Inc., Austin, TX (US)

( * ) Notice: Subject to any disclaimer, the term of this patent is extended or adjusted under 35 U.S.C. 154(b) by 517 days.

(21) Appl. No.: 14/555,346

(22) Filed: Nov. 26, 2014

(65) Prior Publication Data
US 2016/0149591 A1 May 26, 2016

(51) Int. Cl.
*H03M 13/27* (2006.01)
*H03M 13/29* (2006.01)
*G06F 11/10* (2006.01)

(52) U.S. Cl.
CPC ..... *H03M 13/2714* (2013.01); *H03M 13/276* (2013.01); *H03M 13/2775* (2013.01)

(58) Field of Classification Search
None
See application file for complete search history.

(56) References Cited

U.S. PATENT DOCUMENTS 6,845,482 B2 * 1/2005 Yao .................. H03M 13/2714
714/755

7,170,432 B2 * 1/2007 Ettorre ............. H03M 13/2714
341/50

(Continued)

FOREIGN PATENT DOCUMENTS

WO   WO/2004/051864   6/2004
WO   WO/2004/055992   7/2004

OTHER PUBLICATIONS

Rizwan Asghar, Di Wu, Johan Eilert and Dake Liu, Linköping University, Department of Electrical Engineering, Computer Engineering, Memory Conflict Analysis and Implementation of a Reconfigurable Interleaver Architecture Supporting Unified Parallel Turbo Decoding, Journal of Signal Processing Systems for Signal, Image, and Video Technology, (vol. 60), Issue 1, pp. 15-29, published Jul. 2010. DOI=10.1007/s11265-009-0394-8 http://dx.doi.org/10.1007/s11265-009-0394-8 http://urn.kb.se/resolve?urn=urn:nbn:se:liu:diva-25599.

(Continued)

*Primary Examiner* — Justin R Knapp
(74) *Attorney, Agent, or Firm* — Sherry W. Schumm

(57) ABSTRACT

A turbo decoder decodes encoded data using a regenerated interleaver sequence. An addressable column index memory stores column indexes of the encoded data during an input phase of a turbo decode operation. An address generator generates the regenerated interleaver sequence based on the column indexes and computed data. In embodiments the address generator can read column indexes from the addressable column index memory, compute the computed data by permuting row indexes in a same row permuting order as an encoder that encoded the encoded data, combine the column indexes so read and the row indexes so permuted, use a row counter, and identify out of bounds addresses using the regenerated interleaver sequence.

17 Claims, 5 Drawing Sheets

(56) References Cited

U.S. PATENT DOCUMENTS

| | | | |
|---|---|---|---|
| 7,398,446 B2 | 7/2008 | Garrett et al. | |
| 7,437,650 B2 * | 10/2008 | Bickerstaff | H03M 13/2714 |
| | | | 714/755 |
| 8,433,987 B2 * | 4/2013 | Fan | H03M 13/2957 |
| | | | 714/774 |
| 9,467,252 B2 * | 10/2016 | Bahary | H04L 1/0071 |
| 2004/0103359 A1 | 5/2004 | Molina | |

OTHER PUBLICATIONS

3GPP standard 25.212, Universal Mobile Telecommunications System (UMTS), Multiplexing and channel coding (FDD), Technical Specification Group, Radio Access Network, version 10.1.0 Release 10, pp. 1-116, Dec. 2010.

* cited by examiner

TURBO DECODERS WITH STORED COLUMN INDEXES FOR INTERLEAVER ADDRESS GENERATION AND OUT-OF-BOUNDS DETECTION AND ASSOCIATED METHODS

BACKGROUND OF THE INVENTIONS

1. Technical Field

Embodiments of the present invention relate to turbo decoders and, more particularly, relate to memory techniques for a turbo decoder.

2. Description of the Related Art

Telecommunications involves sending information from a transmitter to a receiver. Channel coding is a process performed by the transmitter of adding extra information bits or redundant bits to the information to be sent. The receiver then uses the redundant bits to help it identify the sent message.

Typically signals are encoded before being sent to a cellular telephone using a method of encoding defined in a cellular standards specification. An encoder in the transmitter adds redundancy using a predetermined method and a decoder in the receiver uses knowledge of the redundancy method to increase reliability of data demodulation and decoding. Typically high latency sensitive traffic signals such as voice are encoded using a convolutional coder and lower latency traffic signals such as data are encoded using a turbo encoder. While cellular standards specifications specify the requirement for turbo encoding a signal, these cellular standards specifications do not typically specify the operations for turbo decoding a signal. Turbo decoding is basically defined as the reverse process of turbo encoding.

Turbo encoding is one method of encoding by adding redundancy. A turbo encoder uses an interleaver to shuffle the bits to be transmitted into a random order. The interleaving process increases the probability that errors introduced while the coded data is transmitted can be overcome and the original information reconstructed at the receiver. A turbo decoder is responsible for reversing the interleaving process. To unwind the interleaving procedure, it saves power to generate the desired bit's address in memory rather than move the data itself. The turbo decoder uses an iterative algorithm. The Turbo Decoder decodes using plural maximum a posteriori (MAP) estimates. The turbo decoder alternates between processing received samples relating to $(x_k, z_k)$ called even MAP estimates, and processing received samples relating to $z'_k$ called odd MAP estimates. The two MAP estimates are together called an iteration. For example, if the turbo decoder performs four iterations that means it would have processed 8 MAP estimates.

The turbo encoder and turbo decoder are an integral part of telecom standards with data rates reaching upwards of 100 Mbps (million bits per second). These high data rates create new demands on processing speed which require multiple bits to be processed in parallel. To achieve this, a parallel architecture of multiple turbo decoder engines is used. To further increase throughput, the input can be double buffered. In this architecture, one input buffer is loaded while the other is decoded. In this case, the interleaver addresses must be generated twice during a turbo decode operation; once during the load phase and once during the decode phase. There are two ways to turbo decode in parallel. A first way is to break a coded block into smaller sub-blocks, and process those in parallel. A second way is to process multiple coded blocks in parallel. The first approach increases decoding latency and input random access memory (RAM) requirements. The second approach may have problems with collisions.

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein:

DETAILED DESCRIPTION OF THE PREFERRED EMBODIMENTS

Figure 1:
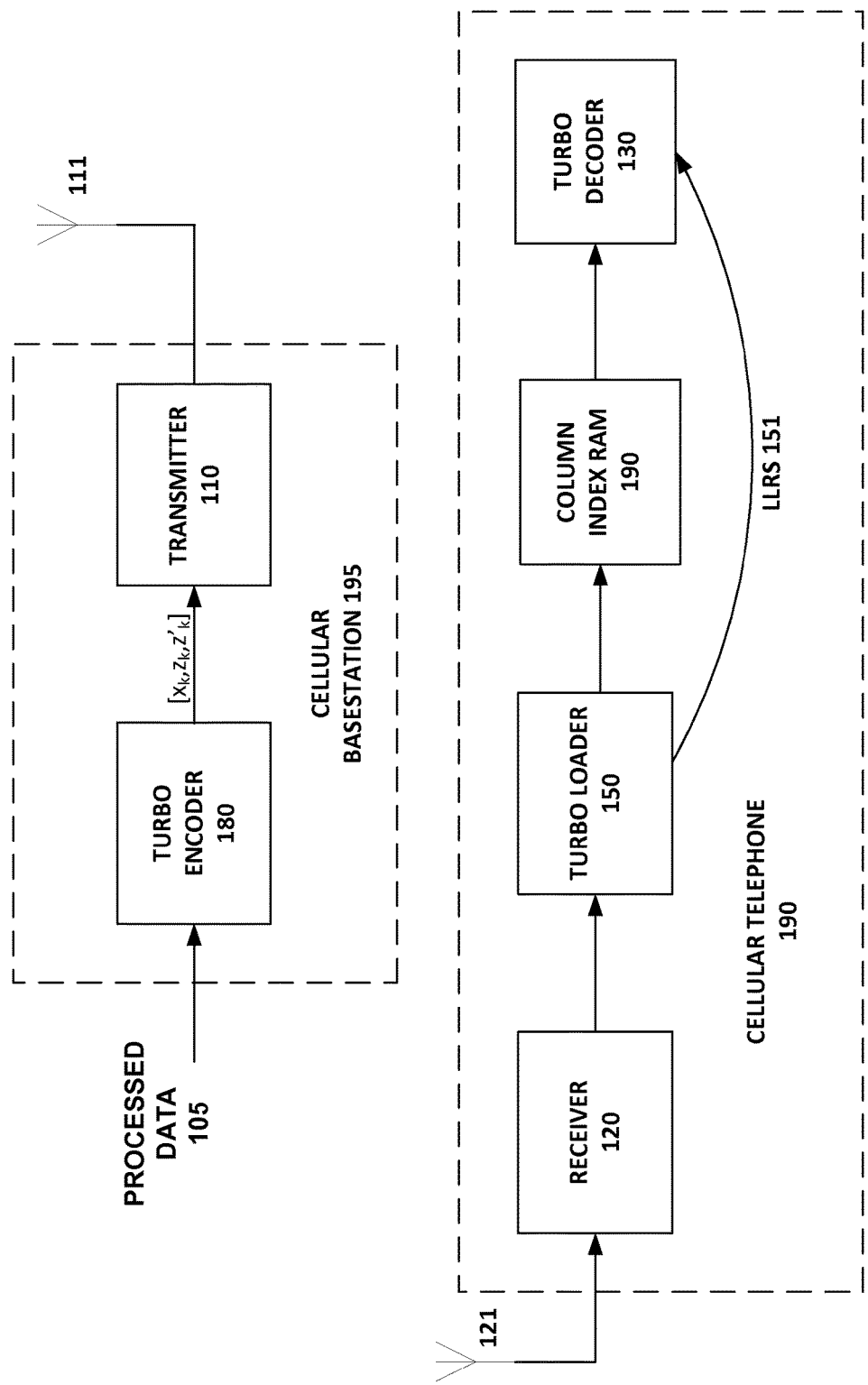
FIG. 1 illustrates a schematic block diagram of a turbo encoder and transmitter of an exemplary cellular base station and a schematic block diagram of a radio receiver, memory, turbo loader, turbo decoder of an exemplary cellular telephone according to one embodiment of the present invention.

FIG. 1 illustrates a schematic block diagram of an exemplary cellular base station 195 and an exemplary cellular telephone 190 according to an exemplary embodiment of the present invention. A turbo encoder 180 and transmitter 110 are in the cellular base station 195 coupled to an associated antenna 111. The turbo encoder 180 sends encoded data $[x_k, z_k, z'_k]$ to the transmitter 110.

The cellular base station 195 takes in voice or internet data and processes it. After some processing, the processed data 105 is sent to the turbo encoder 180. The turbo encoder 180 takes input bits $x_k$, and adds redundant information. A predetermined interleaver sequence is used to derive this redundant information. Both the encoder and the decoder are preprogrammed according to an agreed upon specification standard with the same predetermined interleaving sequence. This redundant information is labeled $z_k$ and $z'_k$, and shown in FIG. 2. The redundant information is added to the output of an encoder in order to help the decoder correct errors in the data $x_k$. The data and redundant information $[x_k, z_k, z'_k]$ go through the transmitter 110 and over the air to the receiver 120.

A radio receiver 120, a turbo loader 150, column index RAM memory 190, and a turbo decoder 130 is in the cellular telephone 190 coupled to an associated antenna 121. The turbo loader 150 operates as logarithms of likelihood ratios (LLRs) 151 coming out of the radio receiver 120 and sends them to the turbo decoder 130.

The radio receiver 120 and antenna 110 can be typical of that used in a portable cellular telephone 190 or other mobile cellular radio device. The receiver 120 demodulates a received signal and may descramble the signal depending on the cellular standards specification needed. Next the received signal is decoded. Depending on the type of signal received, a turbo loader 150 and a turbo decoder 130 is used to decode the demodulated received signal.

The column index RAM memory 190 stores the interleaver column indexes during the loading process and makes them available during the iterations processed by the turbo decoder 130. While a random access memory RAM is one preferred embodiment for the column index RAM memory 190, any addressable memory can be used such as flash or latches or flip flops. These so-called iterations can place heavy demands on the random access memory RAM or other memory and are performed by multiple, parallel turbo decoder engines within the turbo decoder 130. What is needed is an approach to reduce demands on memory.

The column indexes are computed based on knowledge of the interleaver in the encoder 180. They are written into the column index RAM 190 by the turbo loader 150. The turbo decoder 130 then reads the column indexes out of the column index RAM 190 concurrently for each of the turbo decoder engines to arrive at a location for the bit transmitted. The interleaver in certain embodiments can be a row-column interleaver with intra-row and inter-row permutations, which is defined, by way of example, in the 3rd Generation Partnership Project (3GPP) cellular specification 25.213 Section 4.2.3.2.3. For input that does not fully fill the row-by-column matrix, dummy bits are inserted into the input before interleaving but are not transmitted. These dummy bits create a challenge in calculating the position of a given bit in its received order.

Computing the interleaving sequence and dummy bit locations every even MAP estimate is a waste of power. Storing the interleaving sequence and null locations takes a large RAM. This problem is addressed by embodiments of the present invention by the approach to generation of the interleaving sequence and dummy bit locations. The interleaving sequence consists of row and column addresses. In embodiments of the present invention, only the address within the row is stored in a RAM. From this, both the dummy bit location and interleaved address can be easily calculated. This saves power and reduces silicon area. More specific and detailed explanation will be given with respect to the below exemplary embodiments and FIGS. 3 and 4.

Figure 2:
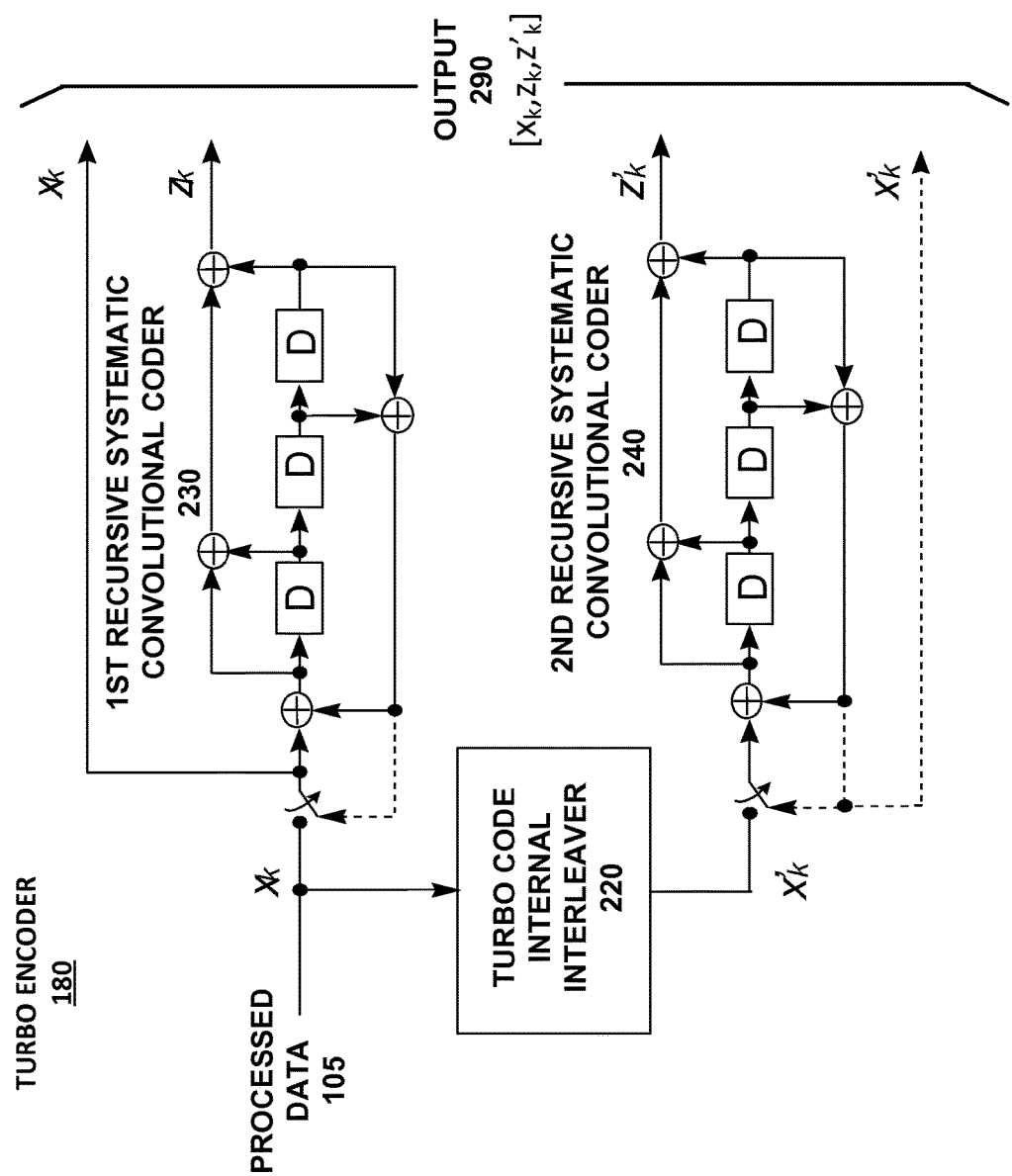
FIG. 2 illustrates a schematic block diagram of an exemplary turbo encoder relating to embodiments of the present invention.

FIG. 2 illustrates a schematic block diagram of an exemplary turbo encoder 180 relating to embodiments. The turbo encoder 180 encodes processed data 105. In FIG. 2, two turbo encoder paths are illustrated, one path for a first recursive systematic convolutional coder 230 and a second path for a second recursive systematic convolutional coder 240, after a turbo code interleaver 220. The second path undergoes an interleaving process which increases the probability that errors introduced while the coded data is transmitted can be overcome and the original information reconstructed at the receiver. Each of the first recursive systematic convolutional coder 230 and the second recursive systematic convolutional coder 240 have the illustrated series of three delays and four feedback and feed forward modulo 2 adders. The output 290 of the turbo encoder 180 is $x_k$ (the input processed data 105), $z_k$ (result of the first recursive systematic convolutional coder 230), and $z'_k$ (result of the second recursive systematic convolutional coder 240). The output 290 of the turbo encoder 180 also has $x'_k$ which is used at the end of a processed data block to ensure the encoder ends in an all zero state.

Figure 3:
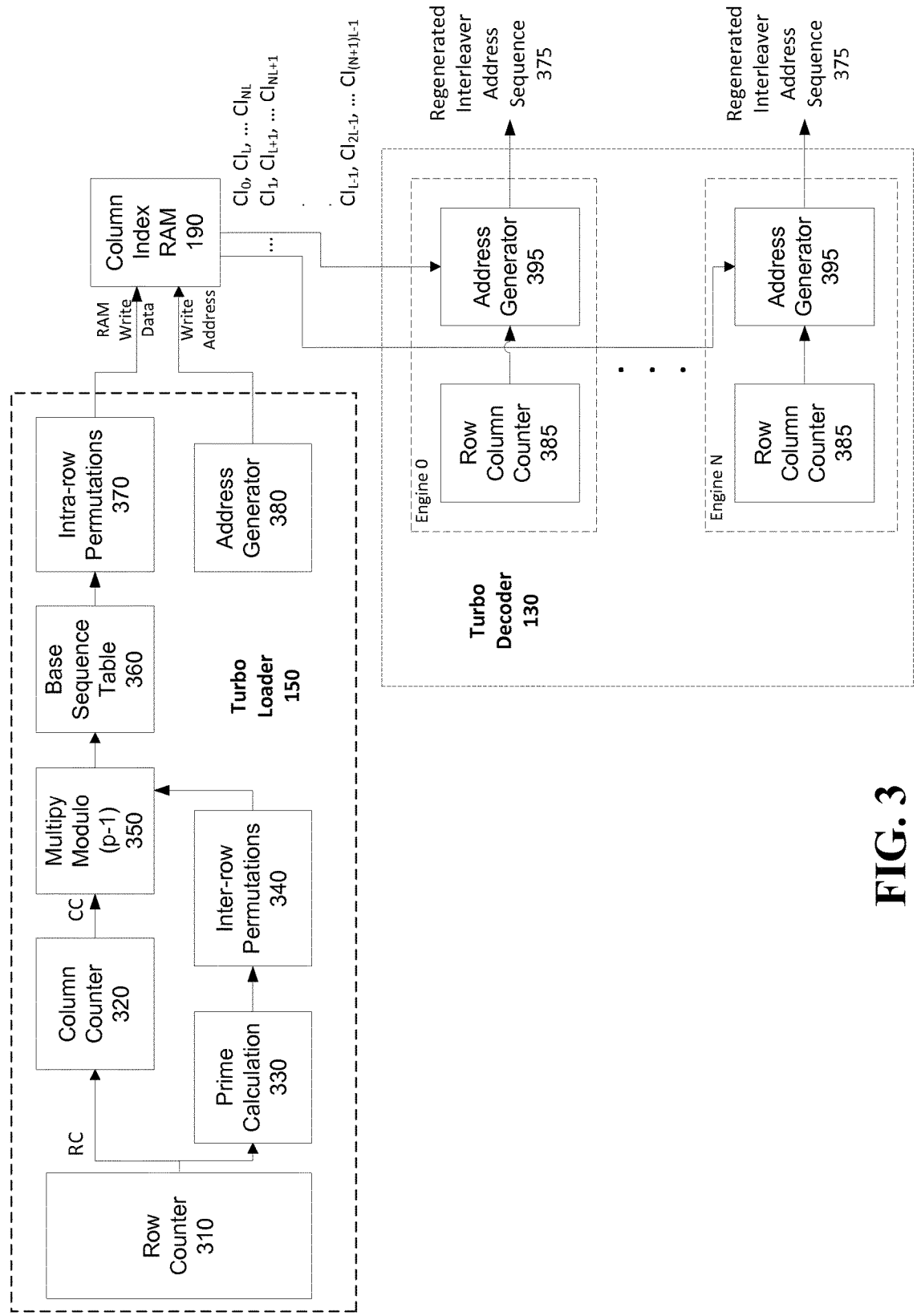
FIG. 3 illustrates a block diagram of the Turbo Loader and the Turbo Decoder and the Column Index RAM according to an exemplary embodiment of the present invention.

FIG. 3 illustrates a block diagram of the turbo loader 150 and the turbo decoder 130 and the column index RAM 190.

While the turbo loader 150 and the turbo decoder 130 also process the LLRs 151 for the traffic flow, the discussion in FIG. 3 does not cover or illustrate this data. Instead, the discussion and illustration of FIG. 3 covers the addressing and control by the turbo loader 150 and the turbo decoder 130 using the column index RAM 190.

The turbo loader 150 generates the interleaving sequence used in 220. The column index RAM stores a portion of the sequence, and the turbo decoder 130 re-generates the portion that wasn't stored. While a random access memory RAM is one preferred embodiment, any addressable memory can be used such as flash or latches or flip flops.

The turbo loader 150 generates the interleaving sequence used in the turbo encoder 220. An example of this sequence is defined in the 3GPP cellular specification 25.213 Section 4.2.3.2.3. The loader's row counter block 310, increments its Row Counter RC until the number of rows R is reached. By way of example, R is defined by the 3GPP cellular specification in 25.212 Section 4.2.3.2.3.2 Table 3. Once R is reached, then the Column Counter 320 increments its Column Counter CC. The Prime Calculation block 330 computes $q_i$ from 25.212 Section 4.2.3.2.3.2 (3) where i=RC. The Inter-row Permutations unit 340, permutes $q_i$ to compute $r_{T(i)}$, such as, in the example from Section 4.2.3.2.3.2 (4) of the UMTS 3GPP cellular specification. Then the Modulo Multiply unit 350 computes $j*r_i$ mod (p−1), as defined in Section 4.2.3.2.3.2 (5), where j=CC and i=RC. The Base Sequence Table 360 evaluates the function s(j), such as, in the example defined in Section 4.2.3.2.3.2 (2) of the 3GPP cellular specification. The output of the Base Sequence Table 360 is $U_i(j)$ the intra-row permutation pattern, such as, in the example defined in Section 4.2.3.2.3.2 (5) of the 3GPP cellular specification. The Intra-row Permutations unit 370, evaluates all of the if statements, such as, in the example in Section 4.2.3.2.3.2 (5) of the 3GPP cellular specification. Its output is the Column Index CI, for CC and RC. The Address Generator block 380 ensures that the CI goes into the Column Index RAM 190 at the address required by the Turbo Decoder 130. They are formatted in RAM 190, so the all the Turbo Decoder engines get the CI they require for that cycle with a single RAM read.

In FIG. 3 in the Turbo Decoder 130, the Row Counter 310 and Column Counter 320 are duplicated inside Row Column Counter 385. There is a Row Column Counter 385 per Decoder Engine, and the counter is initialized to the position of the desired column index. An example of how the RC is permuted by T(RC) is defined in Section 4.2.3.2.3.2 Table 3 of the 3GPP cellular specification. The correct CI is read from Column Index RAM for each engine. Then a Regenerated Interleaver Address 375 can be computed with Interleaver Address$_i$=T(RC$_i$)*C+CI$_i$. Where C is the number of columns in the interleaving matrix, and is defined in 25.212 Section 4.2.3.2.3.1, and i is a clock cycle index. An engine has an out of bounds address to a dummy bit or dummy entry when the Interleaver Address$_i$>=K. An example of K is the block size defined in 25.212 Section 4.2.3.2.3 of the 3GPP cellular specification. These out of bounds addresses are the dummy bit locations.

Figure 4:
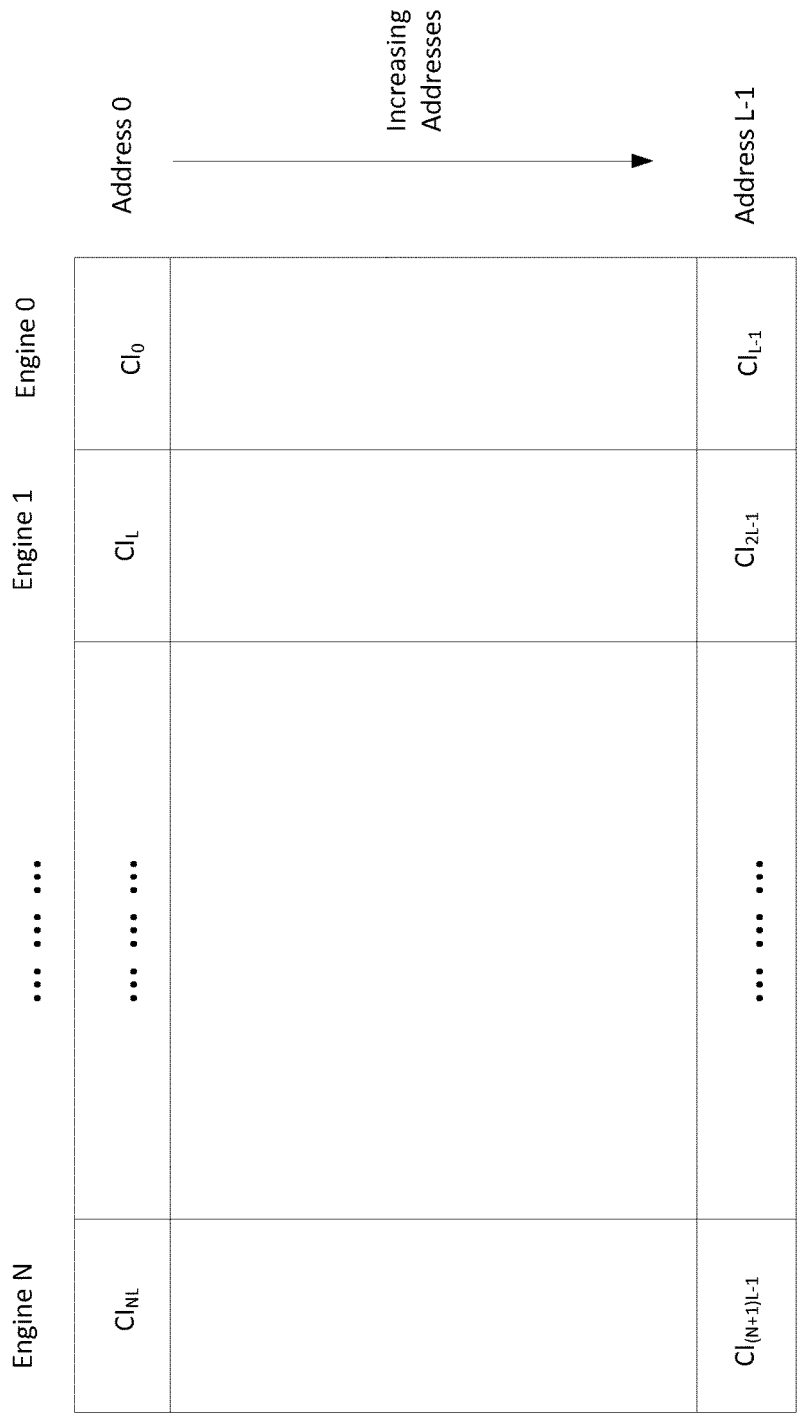
FIG. 4 illustrates a memory diagram of Column Index RAM according to an exemplary embodiment of the present invention.

FIG. 4 illustrates a memory diagram of Column Index RAM 190. This RAM stores the Column Index CI for the interleaving sequence which, by example, is defined in 25.212 Section 4.2.3.2.3 of the 3GPP cellular specification. During decoding, the RAM is read each cycle. A single RAM read returns a RAM word which is an entire row in FIG. 4. The CI values required for all engines are read from a single word in a single cycle. Each engine operates on a sub-block that is L indexes apart, therefore the first word contains $CI_0, CI_L, \ldots, CI_{NL}$. The Column Indexes are stored without regard to the interleaver row they came from. Counters in each Decoder Engine re-count the interleaver rows.

A first problem in prior turbo decoders was the excessive amount of time (cycles) and redundant logic that was needed to re-generate the interleaver addresses during decoding.

A second problem in prior turbo decoders was the need to generate multiple interleaver addresses out of order and identify multiple out-of-bounds interleaver addresses per cycle.

Computing and re-computing the interleaving sequence and dummy entry locations every even MAP estimate is a waste of power. Storing the interleaving sequence and dummy entry locations takes a large RAM. The interleaving sequence consists of row and column indexes. In this present invention, only the column indexes are stored in a RAM. From this the interleaved address and dummy entry presence can be easily calculated. This saves power and reduces silicon area.

When getting the LLR's from the receiver, one index k is processed per cycle. When the turbo decoder is processing, N+1 engines are active and processing N+1 values of k per cycle. In order to compute the entire interleaving sequence during decoding N+1 interleaver computation units would be required, as opposed to one that is required during loading.

To store the entire interleaving sequence including dummy entries would require 5120 storage elements. Each storage element would need to store the index from 0 to K−1, or 13 bits. The total number of bits stored would be 5120*13=65 Kbits. This innovation stores only the Column Index which is 8 bits. So the total RAM required is reduced to 5120*8=40 Kbits.

The turbo loader in embodiments of the present invention generates the Column Index CI and store it in Column Index RAM while getting the input data from the receiver. The turbo decoder then reads the Column Index RAM to retrieve multiple CI's per cycle and can easily compute multiple interleaver addresses and dummy entry locations per cycle. This is possible because the data comes from the receiver at a much slower rate than it is read by the turbo decoder.

This approach solves the first problem of excessive amounts of time (cycles) and redundant logic. Excessive amounts of time (cycles) and redundant logic are addressed because the Column Index is only computed one time in the input phase and stored in the Column Index RAM.

If the column count is CC and the row count is RC, then the interleaver address is RC*C+CC. If the interleaver address is greater than the code block size (K) it is determined to be out-of-bounds. This calculation is done in each engine.

This approach also solves the second problem of the need to generate multiple interleaver addresses out of order and identify multiple out-of-bounds interleaver addresses per cycle. It is resolved because all the Column Indexes are stored. This allows us to read one Column Index RAM 190 address and obtain multiple column indexes CI's in one cycle. Using the multiple column indexes, the interleaver can generate multiple addresses and determine multiple out-of-bounds interleaver addresses per cycle.

Each decode engine generates multiple addresses per cycle while flagging out-of-bounds addresses. More than one out-of-bounds location can be determined per cycle.

Figure 5:
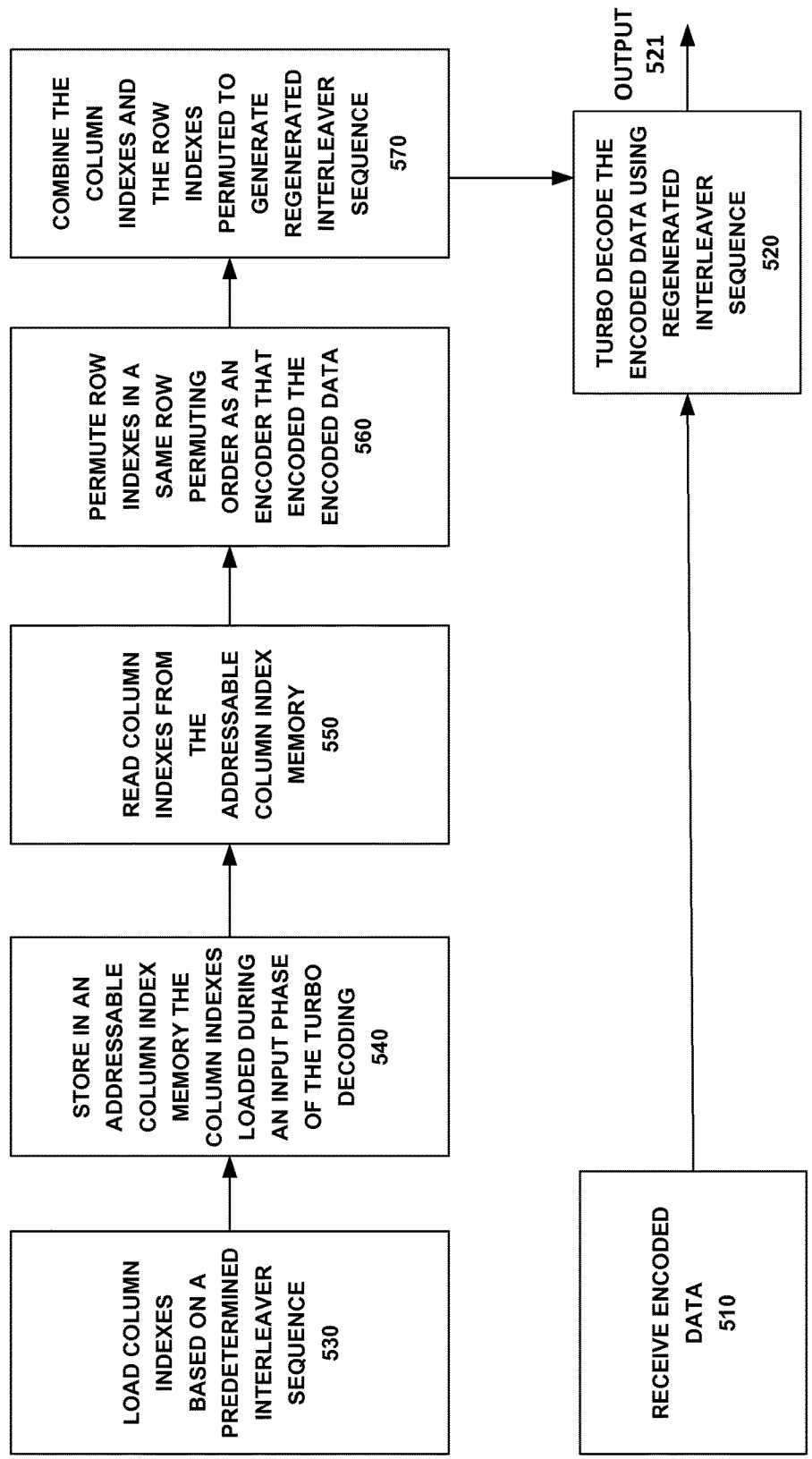
FIG. 5 illustrates a flow diagram of a process performed by turbo decoder engines, a loader, a column index memory and address generators according to an exemplary embodiment of the present invention.

FIG. 5 illustrates a flow diagram of a process performed by turbo decoder engines, a loader, a column index memory and address generators according to an exemplary embodiment of the present invention. In step 710, systematic data is stored in words in a systematic memory. Step 510 receives encoded data. Step 520 turbo decodes the encoded data received in step 510 using a regenerated interleaver sequence. An output 521 of the turbo decoder is provided from step 520. Steps 530 through 570 will provide the regenerated interleaver sequence for the turbo decoding of step 520. Step 530 loads column indexes based on a predetermined interleaver sequence. Step 540 stores in an addressable column index memory the column indexes loaded in step 530 during an input phase of the turbo decoding. After step 540, step 550 reads the column indexes from the addressable column index memory. After step 550, step 560 permutes row indexes in a same row permuting order as an encoder that encoded the encoded data. Step 570 combines the column indexes and the row indexes permuted in step 560 to generate the regenerated interleaver sequence.

While the turbo decoder in the embodiments of the present invention can be used by any methods or apparatus, the turbo decoder in the embodiments of the present invention can be used by any methods or apparatus that use a 3GPP interleaver in the turbo encoding process such as Group System for Mobile communications (GSM), Universal Mobile Telecommunications System (UMTS) or High-Speed Downlink Packet Access (HSDPA).

An embodiment of a turbo decoder includes a plurality of turbo decoder engines 130, a loader 150, an addressable column index memory 190, and a plurality of address generators 395. The plurality of turbo decoder engines is for turbo decoding the encoded data using a regenerated interleaver sequence. The loader is for generating column indexes based on a predetermined interleaver sequence. The loader is for generating column indexes based on a predetermined interleaver sequence. The addressable column index memory is operatively coupled to the receiver, the loader and the turbo decoder engines to store the column indexes stored during an input phase of turbo decode operations of the turbo decoder engines. The plurality of address generators are each operatively coupled to the addressable column index memory and a corresponding turbo decoder engine based on the column indexes and computed data to generate the regenerated interleaver sequence.

According to a further embodiment, the address generators read column indexes from the addressable column index memory.

According to a further embodiment, the address generators compute the computed data for a corresponding turbo decoder engine by permuting row indexes in a same row permuting order as an encoder that encoded the encoded data and the address generators combine the column indexes so read and the row indexes so permuted to create the regenerated interleaver sequence.

According to a further embodiment, each of the address generators are operatively coupled to respective row column counters to select a permutated row.

According to a further embodiment, the address generator identifies out of bounds addresses using the regenerated interleaver sequence.

According to a further embodiment, the loader comprises a base sequence table and an intra-row permutations unit operatively coupled to the base sequence table to generate the column indexes.

According to a further embodiment, the loader further comprises an address generator operatively coupled to the addressable column index memory to store a plurality of the column indexes to each individual address location of the addressable column index memory.

According to a further embodiment, the address generators are operatively coupled to the addressable column index memory to read a plurality of the column indexes from each individual address location of the addressable column index memory.

According to a further embodiment, a radio receiver is operatively coupled to the loader to receive the encoded data.

An embodiment of a method decodes encoded data. The encoded data is turbo decoded using a regenerated interleaver sequence. Column indexes are loaded based on a predetermined interleaver sequence. The column indexes loaded during an input phase of the turbo decoding are stored in an addressable column index memory. The regenerated interleaver sequence is generating based on the column indexes stored and computed data.

According to a further embodiment, the predetermined interleaver sequence is generated. Column indexes are read from the addressable column index memory. The computed data is computed by permuting row indexes in a same row permuting order as an encoder that encoded the encoded data. The column indexes and the row indexes permuted are combined to generate the regenerated interleaver sequence.

According to a further embodiment, the permuting of the row indexes selects a permutated row using a row column counter.

According to a further embodiment, the generating of the regenerated interleaver sequence identifies out of bounds addresses using the regenerated interleaver sequence so generated.

According to a further embodiment, the loading generates the column indexes based on at least a base sequence and intra-row permutations.

According to a further embodiment, the loading uses an address generator operatively coupled to the addressable column index memory to store a plurality of the column indexes to each individual address location of the addressable column index memory.

According to a further embodiment, the generating of the regenerated interleaver sequence reads a plurality of the column indexes from each individual address location of the addressable column index memory.

An embodiment of a method decodes encoded data. The encoded data is received. The encoded data received is turbo decoded using a regenerated interleaver sequence. Column indexes are loaded based on a predetermined interleaver sequence. The column indexes loaded during an input phase of the turbo decoding are stored in an addressable column index memory. The column indexes from the addressable column index memory are read. Row indexes are permuted in a same row permuting order as an encoder that encoded the encoded data. The column indexes and the row indexes permuted are combined to generate the regenerated interleaver sequence.

According to a further embodiment, the permuting row indexes select a permutated row using a row column counter.

According to a further embodiment, the permuting row indexes identify out of bounds addresses using the regenerated interleaver sequence generated.

The signal processing techniques disclosed herein with reference to the accompanying drawings can be implemented on one or more digital signal processors (DSPs) or other microprocessors. Nevertheless, such techniques could instead be implemented wholly or partially as hardwired circuits. The RAM could refer to a physical RAM instance in silicon, or a buffer in a DSP. Further, it is appreciated by those of skill in the art that certain well known digital processing techniques are mathematically equivalent to one another and can be represented in different ways depending on choice of implementation.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. They can have different configurations than the examples illustrated in the drawings. Any benefits, advantages, or solutions to problems that are described herein with regard to specific embodiments are not intended to be construed as a critical, required, or essential feature or element of any or all the claims.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A mobile cellular radio device including a turbo decoder for decoding encoded data, comprising:
a radio receiver coupled to an antenna and configured to receive a signal from the antenna, and to demodulate the signal to produce the encoded data;
a plurality of turbo decoder engines implemented in one or more processors coupled to the radio receiver, wherein the plurality of turbo decoder engines is configured to turbo decode the encoded data using a regenerated interleaver sequence;
a loader implemented in the one or more processors, wherein the loader is configured to generate column indexes based on a predetermined interleaver sequence;
an addressable column index memory operatively coupled to the loader and the plurality of turbo decoder engines and configured to store the column indexes stored during an input phase of turbo decode operations of the plurality of turbo decoder engines; and
a plurality of address generators implemented in the one or more processors, wherein each of the address generators is operatively coupled to the addressable column index memory and a corresponding turbo decoder engine and is configured to generate the regenerated interleaver sequence based on the column indexes and permuted row indexes.

2. The mobile cellular radio device according to claim 1, wherein the plurality of address generators are configured to read the column indexes from the addressable column index memory;
wherein the plurality of address generators are configured to compute the permuted row indexes for a corresponding turbo decoder engine by permuting row indexes in a same row permuting order as an encoder that encoded the encoded data; and wherein the plurality of address generators are configured to combine the column indexes and the permuted row indexes to create the regenerated interleaver sequence.

3. The mobile cellular radio device according to claim 2, wherein each of the address generators are operatively coupled to respective row column counters and is configured to select a permutated row.

4. The mobile cellular radio device according to claim 1, wherein the address generator is configured to identify out of bounds addresses using the regenerated interleaver sequence.

5. The mobile cellular radio device according to claim 1, wherein the loader comprises
   a base sequence table; and
   an intra-row permutations unit operatively coupled to the base sequence table and configured to generate the column indexes.

6. The mobile cellular radio device according to claim 1, wherein the loader further comprises an additional address generator operatively coupled to the addressable column index memory and configured to store a plurality of the column indexes to each individual address location of the addressable column index memory.

7. The mobile cellular radio device according to claim 1, wherein each of the address generators are operatively coupled to the addressable column index memory and configured to read a plurality of the column indexes from each individual address location of the addressable column index memory.

8. The mobile cellular radio device according to claim 1, further comprising a radio receiver operatively coupled to the loader and configured to receive the encoded data.

9. A method of decoding encoded data performed by a mobile cellular radio device that includes an antenna, a radio receiver coupled to the antenna and configured to receive and demodulate a signal from the antenna to produce the encoded data, one or more processors coupled to the radio receiver and configured to decode the encoded data, and an addressable column index memory, the method performed by the one or more processors comprising the steps of:
   (a) loading column indexes based on a predetermined interleaver sequence;
   (b) storing in the addressable column index memory the column indexes loaded in said step (a) during an input phase of the method;
   (c) generating a regenerated interleaver sequence based on the column indexes stored in said step (b) and permuted row indexes; and
   (d) turbo decoding the encoded data using the regenerated interleaver sequence.

10. The method of decoding according to claim 9, wherein said step (c) of generating the predetermined interleaver sequence comprises the substeps of
   (c)(1) reading column indexes from the addressable column index memory;
   (c)(2) computing the permuted row indexes by permuting row indexes in a same row permuting order as an encoder that encoded the encoded data; and
   (c)(3) combining the column indexes of said step (c)(1) and the permuted row indexes computed in said step (c)(2) to generate the regenerated interleaver sequence.

11. The method of decoding according to claim 10, wherein said step (c)(2) of computing the permuted row indexes comprises the sub step of selecting a permutated row using a row column counter.

12. The method according to claim 9, wherein said step (c) of generating the regenerated interleaver sequence comprises the substep of identifying out of bounds addresses using the regenerated interleaver sequence generated in said step (c).

13. The method according to claim 9, wherein said step (a) of loading generates the column indexes based on at least a base sequence and intra-row permutations.

14. The method according to claim 9, wherein said step (a) of loading further comprises an additional address generator operatively coupled to the addressable column index memory storing a plurality of the column indexes to each individual address location of the addressable column index memory.

15. The method according to claim 9, wherein said step (c) of generating the regenerated interleaver sequence comprises the substep of reading a plurality of the column indexes from each individual address location of the addressable column index memory.

16. A method of decoding performed by a mobile cellular radio device that includes an antenna, a radio receiver coupled to the antenna, one or more processors coupled to the radio receiver, and an addressable column index memory, the method comprising the steps of:
   (a) the radio receiver receiving a signal from the antenna and demodulating the signal to produce encoded data;
   (b) loading, by the one or more processors, column indexes based on a predetermined interleaver sequence;
   (c) the one or more processors storing in the addressable column index memory the column indexes loaded in said step (b) during an input phase of the method;
   (d) reading, by the one or more processors, column indexes from the addressable column index memory;
   (e) the one or more processors permuting row indexes in a same row permuting order as an encoder that encoded the encoded data;
   (f) the one or more processors combining the column indexes of said step (d) and the row indexes permuted in said step (e) to generate a regenerated interleaver sequence; and
   (g) the one or more processors turbo decoding said encoded data received in said step (a) using the regenerated interleaver sequence.

17. The method according to claim 16, wherein said step (e) of permuting row indexes selects a permutated row using a row column counter.

* * * * *